(12) United States Patent
Tokuya et al.

(10) Patent No.: US 11,335,617 B2
(45) Date of Patent: May 17, 2022

(54) ELECTRONIC COMPONENT

(71) Applicant: Murata Manufacturing Co., Ltd., Kyoto-fu (JP)

(72) Inventors: Hiroaki Tokuya, Nagaokakyo (JP); Yuichi Sano, Nagaokakyo (JP); Toshihiro Tada, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 61 days.

(21) Appl. No.: 16/744,449

(22) Filed: Jan. 16, 2020

(65) Prior Publication Data
US 2020/0152536 A1    May 14, 2020

Related U.S. Application Data

(63) Continuation of application No. PCT/JP2018/026451, filed on Jul. 13, 2018.

(30) Foreign Application Priority Data

Jul. 21, 2017  (JP) .............................. JP2017-142134

(51) Int. Cl.
    *H01L 23/31*  (2006.01)
    *H01L 23/29*  (2006.01)
    *H01L 21/56*  (2006.01)

(52) U.S. Cl.
    CPC .......... *H01L 23/3142* (2013.01); *H01L 21/56* (2013.01); *H01L 23/29* (2013.01); *H01L 23/295* (2013.01); *H01L 2924/18161* (2013.01)

(58) Field of Classification Search
    CPC ... H01L 23/295; H01L 23/3142; H01L 23/28; H01L 23/293; H01L 23/296; H01L 23/3737
    See application file for complete search history.

(56) References Cited

U.S. PATENT DOCUMENTS 6,798,072 B2 *  9/2004  Kajiwara .............. H01L 21/563
                                                         257/778
7,632,715 B2 * 12/2009  Hess .................... H01L 21/561
                                                         257/682

FOREIGN PATENT DOCUMENTS

JP    H01-115255 U    8/1989
JP    H09-157440 A    6/1997
(Continued)

OTHER PUBLICATIONS

International Search Report issued in PCT/JP2018/026451; dated Sep. 11, 2018.
(Continued)

*Primary Examiner* — Zandra V Smith
*Assistant Examiner* — Abbigale A Boyle
(74) *Attorney, Agent, or Firm* — Studebaker & Brackett PC

(57) ABSTRACT

An electronic component whose reliability is less likely to decrease while its thermal conductivity is maintained. A semiconductor chip is mounted on a substrate. The semiconductor chip is sealed with a sealing resin layer. The sealing resin layer includes a binder and two types of fillers having a plurality of particles dispersed in the binder. As the two types of fillers, fillers at least one of whose physical quantities, which are average particle diameter and density, are different from each other are used. The total volume density of the fillers in the sealing resin layer decreases in an upward direction from the substrate, and a portion of the sealing resin layer in a height direction of the sealing resin layer has an area in which the two types of fillers are present in a mixed manner.

19 Claims, 4 Drawing Sheets

(56) References Cited

FOREIGN PATENT DOCUMENTS

| JP | H-09157440 A | * | 6/1997 | ............ B29C 39/10 |
|---|---|---|---|---|
| JP | 2015-035567 A | | 2/2015 | |
| JP | 2015-192007 A | | 11/2015 | |
| JP | 2017-098353 A | | 6/2017 | |
| WO | 2017/038941 A1 | | 3/2017 | |

OTHER PUBLICATIONS

International Preliminary Report on Patentability and Written Opinion issued in PCT/JP2018/026451; dated Jan. 21, 2020.

* cited by examiner

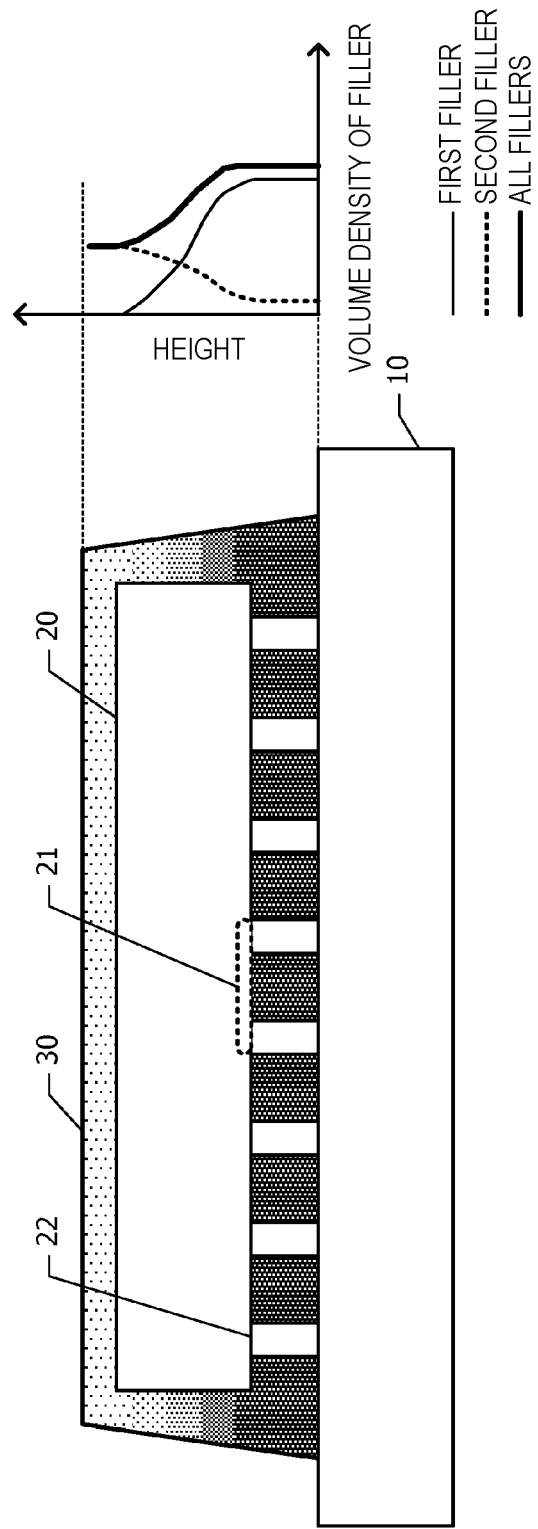

Fig.2A
|  | FIRST EMBODIMENT | FIRST MODIFICATION | SECOND MODIFICATION |
|---|---|---|---|
| AVERAGE PARTICLE DIAMETER | DIFFERENT | SAME | DIFFERENT |
| DENSITY | SAME | DIFFERENT | DIFFERENT |
Fig.2B
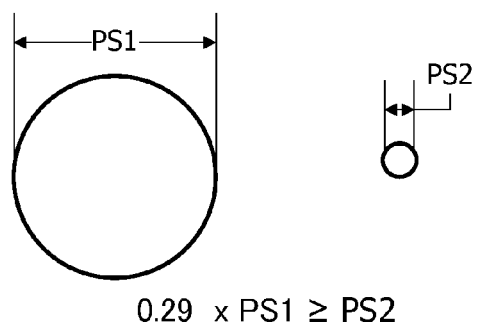
$0.29 \times PS1 \geq PS2$
Fig.2C
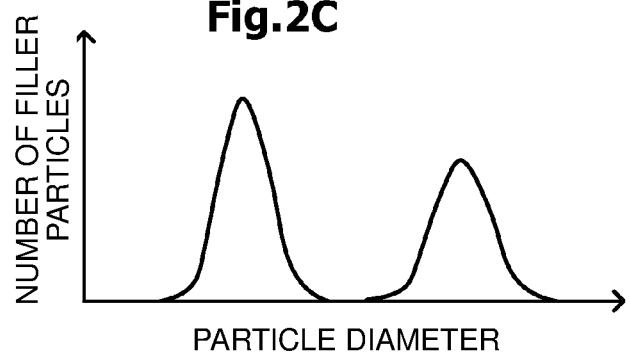
Fig.2D
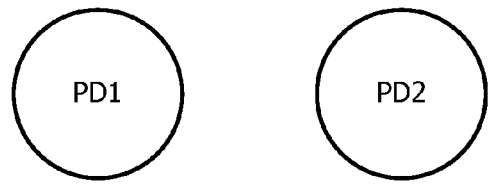
$0.5 \times PD1 \geq PD2$

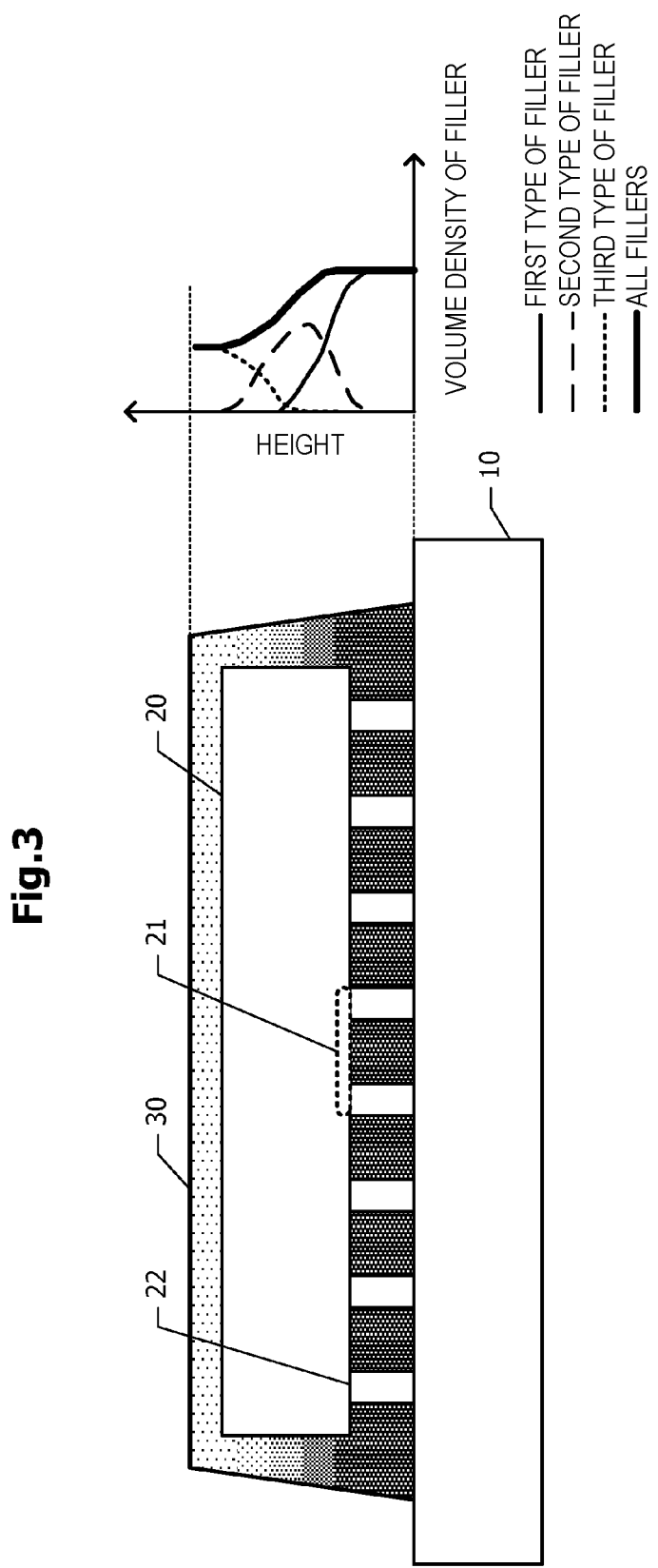

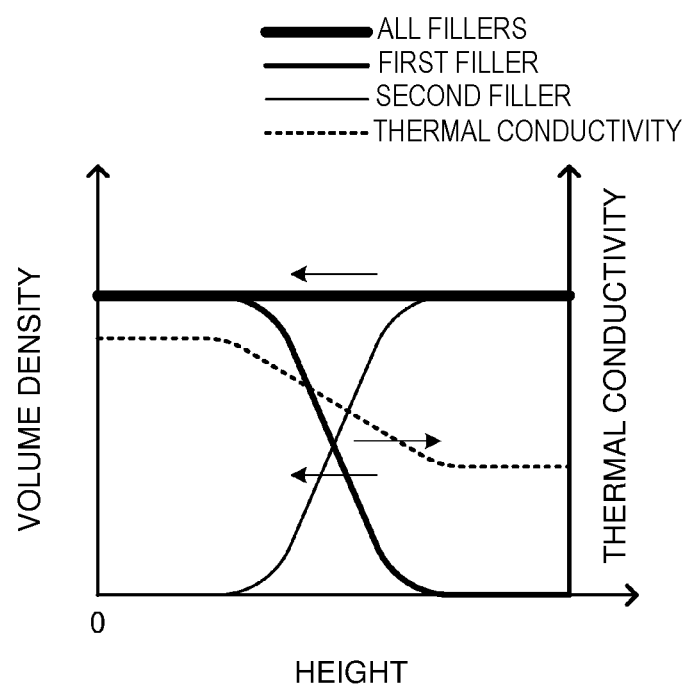

ELECTRONIC COMPONENT

CROSS-REFERENCE TO RELATED APPLICATIONS

This application claims benefit of priority to International Patent Application No. PCT/JP2018/026451, filed Jul. 13, 2018, and to Japanese Patent Application No. 2017-142134, filed Jul. 21, 2017, the entire contents of each are incorporated herein by reference.

BACKGROUND

Technical Field

The present disclosure relates to an electronic component in which a semiconductor chip is mounted on a substrate and sealed with a sealing resin.

Background Art

An electronic component that includes a substrate, a semiconductor chip mounted on the substrate, and a sealing resin layer sealing the semiconductor chip is commonly known as described, for example, in Japanese Unexamined Patent Application Publication No. 2015-35567. An electronic component that is disclosed in Japanese Unexamined Patent Application Publication No. 2015-35567 is formed by laminating a resin sheet in such a manner that the resin sheet is in contact with a substrate and an electronic device. In order to laminate the resin sheet, hot pressing or a method using a laminator or the like is employed.

The resin sheet is divided into a first resin layer and a second resin layer. The first resin layer has heat-conductive particles and is designed so as to have a thermal conductivity of 1 W/mK or more. It is preferable that the second resin layer include a filler. This filler has an effect of favorably reducing the coefficient of linear expansion of the second resin layer. The first resin layer is in contact with the substrate and the electronic device. Since the first resin layer has a high thermal conductivity, heat generated in the electronic device can be released to the substrate.

SUMMARY

In the electronic component disclosed in Japanese Unexamined Patent Application Publication No. 2015-35567, a clear interface is formed between the first resin layer and the second resin layer. In the case where the thermal expansion coefficient of the first resin layer and the thermal expansion coefficient of the second resin layer are different from each other, stress is generated at the interface between the first resin layer and the second resin layer due to the difference in thermal expansion coefficient. Concentration of stress at the interface between the first resin layer and the second resin layer makes the sealing resin layer including the first resin layer and the second resin layer vulnerable to thermal history, and this leads to a decrease in reliability.

Accordingly, the present disclosure provides an electronic component whose reliability is less likely to decrease while its thermal conductivity is maintained.

An electronic component according to an aspect of the present disclosure includes a substrate, a semiconductor chip that is mounted on the substrate, and a sealing resin layer that seals the semiconductor chip. The sealing resin layer includes a binder and at least two types of fillers that have a plurality of particles dispersed in the binder and at least one of whose physical quantities, which are average particle diameter and density, are different from each other. A total volume density of the fillers in the sealing resin layer decreases in an upward direction from the substrate. A portion of the sealing resin layer in a height direction of the sealing resin layer has an area in which the two types of fillers are present in a mixed manner.

In general, the thermal conductivity of a filler is higher than the thermal conductivity of a binder resin. Thus, heat that is generated by a semiconductor chip is more likely to be conducted through a filler than through a binder resin. Since the total volume density of the fillers in the sealing resin layer decreases in the upward direction from the substrate, heat generated by the semiconductor chip is preferentially conducted to the substrate side. In addition, since the sealing resin layer has the area in which the two types of fillers are present in a mixed manner, variations in the coefficient of thermal expansion in the height direction of the sealing resin layer become moderate. This reduces concentration of stress due to temperature changes. As a result, decrease in the reliability due to temperature changes can be suppressed.

BRIEF DESCRIPTION OF THE DRAWINGS

FIG. 1 includes a sectional view of an electronic component according to a first embodiment of the present disclosure and a graph illustrating the volume density of each filler;

FIG. 2A is a table illustrating comparison of the particle diameters and the densities of two types of fillers used in the electronic component according to the first embodiment and in electronic components according to modifications of the first embodiment; FIG. 2B is a schematic diagram illustrating particles of the two types of fillers used in the electronic component according to the first embodiment; FIG. 2C is a graph illustrating an exemplary distribution of the particle diameters of all the fillers dispersed throughout a sealing resin layer of the electronic component according to the first embodiment; and FIG. 2D is a schematic diagram illustrating particles of the two types of fillers used in the electronic component according to the first modification of the first embodiment;

FIG. 3 includes a sectional view of an electronic component according to a second embodiment and a graph illustrating the volume density of each filler; and FIG. 4 is a graph illustrating volume density distribution and thermal conductivity distribution of each filler included in a sealing resin layer of an electronic component according to a third embodiment.

DETAILED DESCRIPTION

First Embodiment

An electronic component according to the first embodiment will be described with reference to FIG. 1 to FIG. 2D.

FIG. 1 includes a sectional view of the electronic component according to the first embodiment and a graph illustrating distribution of the volume densities of fillers. The electronic component according to the first embodiment includes a substrate 10, a semiconductor chip 20 that is mounted on the substrate 10, and a sealing resin layer 30 that seals the semiconductor chip 20. The substrate 10 is, for example, a package substrate (an interposer). The semiconductor chip 20 is, for example, a power amplifier in which a heterojunction bipolar transistor (HBT) is formed on a GaAs substrate.

The semiconductor chip 20 is mounted face down on the substrate 10 by flip-chip bonding. For example, the semiconductor chip 20 includes a heterojunction bipolar transistor (HBT) 21 that is formed on a surface of the semiconductor chip 20, the surface facing the substrate 10, and the semiconductor chip 20 is mechanically fixed to and electrically connected to the substrate 10 with a plurality of bumps 22 interposed therebetween. A space between the substrate 10 and the semiconductor chip 20 is filled with the sealing resin layer 30, and the sealing resin layer 30 is provided on a portion of the substrate 10 surrounding the semiconductor chip 20 and also provided on the semiconductor chip 20.

The sealing resin layer 30 includes a binder and two types of fillers that are dispersed in the binder. The two types of fillers each have a plurality of fine particles. Materials having the same composition are used for the two types of fillers, and the average particle diameter of the first filler is different from the average particle diameter of the second filler. As the materials of the fillers, for example, inorganic compounds such as $ZnO$, $TiO_2$, $FeO_2$, $Fe_2O_3$, $Si_3N_4$, $GaN$, $TiN$, $InGaN$, $AlN$, $BN$, $Al_2O_3$, $MgO$, $SiO_2$, and $Mg(OH)_2$ can be used. These inorganic compounds that may be used as the materials of the fillers are not necessarily in a stoichiometric state and may be in a non-stoichiometric state. As the binder, for example, an epoxy resin, a phenolic resin, or the like can be used.

When the particle diameters of the fillers are too small, the viscosity of the binder increases, and the application property, the filling property, and so forth of the binder deteriorate. When the particle diameters of the fillers are too large, the yield is more likely to decrease due to filler attack. Considering these facts, it is preferable that the particle diameter of each of the fillers be 0.1 µm or more and 25 µm or less (i.e., from 0.1 µm to 25 µm). For example, a filler having an average particle diameter of 1 µm and a filler having an average particle diameter of 10 µm may be used.

The graph on the right-hand side of the sectional view of the electronic component according to the first embodiment illustrates an example of the volume density distribution of the fillers in the sealing resin layer 30 in a height direction of the sealing resin layer 30. The horizontal axis denotes the volume density of each of the fillers, and the vertical axis denotes the height when the top surface of the substrate 10 functions as a reference. Here, the wording "volume density of each of the fillers" refers to the mass of each of the fillers per unit volume of the sealing resin layer 30. In the graph, the volume density of the first filler is indicated by a thin solid line, and the volume density of the second filler is indicated by a dashed line. The sum of the volume densities of these two types of fillers is indicated by a bold solid line.

The volume density of the first filler gradually decreases in an upward direction from the substrate 10, and the volume density of the second filler gradually increases in the upward direction from the substrate 10. In this manner, the volume density distribution of the first filler is biased toward a lower area in the sealing resin layer 30 compared with the volume density distribution of the second filler. At least a portion of the sealing resin layer 30 in the height direction has an area in which the two types of fillers are present in a mixed manner. The sum of the volume densities of the two types of fillers gradually decreases in the upward direction from the substrate 10.

A method of manufacturing the electronic component according to the first embodiment will now be described. A sealing resin is prepared by dispersing the two types of fillers into a binder resin that has not yet been cured. The semiconductor chip 20 is mounted face down on the substrate 10 by flip-chip bonding. The substrate 10 on which the semiconductor chip 20 has been mounted is placed into a metal mold for resin molding. After that, the sealing resin including the fillers dispersed therein is injected into the metal mold and then cured, so that the sealing resin layer 30 is formed.

When the sealing resin is injected into the metal mold, the substrate 10 is maintained at a substantially horizontal position such that the semiconductor chip 20 is located on the upward direction side of the substrate 10. As a result, gravity acts in a direction from the semiconductor chip 20 toward the substrate 10. The density of an inorganic filler is generally higher than the density of a binder resin such as an epoxy resin. Thus, the fillers have a tendency to accumulate on the lower side in the binder resin that has not yet been cured. In a state where the sealing resin that has not yet been cured is injected in the metal mold, the two types of fillers do not become uniformly mixed together due to the influence of gravity. As a result, volume density distribution such as that illustrated in the graph in FIG. 1 is generated. For example, a relatively large filler accumulates on the lower side, and a small filler enters the gaps between particles of the relatively large filler. The remaining portion of the small filler that does not enter the gaps is positioned above the large filler, so that the volume density distribution illustrated in the graph in FIG. 1 is generated.

Next, advantageous effects of the electronic component according to the first embodiment will be described.

In general, it is known that the thermal conductivity of the sealing resin layer 30 increases as the volume density of each of the fillers in the sealing resin layer 30 increases. In addition, since the semiconductor chip 20 is mounted face down on the substrate 10, the surface of the semiconductor chip 20 that faces the substrate 10 has a heat-generating area in which heat is generated by the HBT 21 or the like. In the first embodiment, in a portion of the sealing resin layer 30 that is located on the side on which the substrate 10 is present, the total volume density of the fillers is higher than that in a portion of the sealing resin layer 30 that is located on the side on which the top surface of the sealing resin layer 30 is present. Heat generated in the heat-generating area is transferred to the substrate 10 through an area of the sealing resin layer 30 in which the thermal conductivity is relatively high, so that the heat-dissipation performance can be improved.

Since the total volume density of the filler in the portion of the sealing resin layer 30 that is closer to the top surface of the sealing resin layer 30 is lower than that in the portion of the sealing resin layer 30 that is closer to the substrate 10, the total amount of the fillers can be reduced compared with the case of dispersing the fillers approximately uniformly. As a result, cost reduction can be achieved.

When there are variations of the volume densities of the fillers in the sealing resin layer 30, the coefficient of thermal expansion varies. In the first embodiment, the two types of fillers are present in a mixed manner in an area of the sealing resin layer 30 in the height direction, so that the total volume density of the fillers gradually changes in the sealing resin layer 30 in the height direction. In other words, a clear interface is not formed between areas having different total volume densities of the fillers. Thus, stress concentration at an interface due to a difference in the coefficient of thermal expansion is reduced. As a result, for example, separation of the resin layer at such an interface is less likely to occur, and decrease in the reliability due to temperature changes can be suppressed.

In the first embodiment, in order to obtain a sufficient effect of improving the thermal conductivity of the fillers, it is preferable that the average filling percentage of the fillers in the sealing resin layer 30 be equal to or greater than 30% by weight. In addition, in order to obtain a sufficient effect of sealing the semiconductor chip 20, it is preferable that the average filling percentage of the fillers be equal to or less than 70% by weight. Here, the term "filling percentage" refers to the ratio of the mass of the fillers to the total mass per unit volume of the sealing resin layer 30.

FIG. 2A is a table illustrating comparison of the average particle diameters and the densities of two types of fillers used in the electronic component according to the first embodiment and in electronic components according to modifications of the first embodiment. In the first embodiment, as the two types of fillers, fillers having the same density and different average particle diameters are used. In the first modification of the first embodiment, as the two types of fillers, fillers having the same average particle diameter and different densities are used. For example, when materials having different compositions are used for the two types of fillers, the two types of fillers have different densities. In the second modification of the first embodiment, as the two types of fillers, fillers having different densities and different average particle diameters are used.

As in the first embodiment and the first and second modifications of the first embodiment, fillers at least one of whose physical quantities, which are average particle diameter and density, are different from each other are preferably used as the two types of fillers. As a result, the electronic component having a configuration in which the total volume density of the fillers in the sealing resin layer 30 gradually decreases in the upward direction from the substrate 10 (FIG. 1) can be obtained.

The average particle diameter of each of the two types of fillers used in the electronic component according to the first embodiment will now be described with reference to FIG. 2B.

FIG. 2B is a schematic diagram illustrating particles of the two types of fillers. The average particle diameter of the filler having a larger average particle diameter is denoted by the reference sign PS1, and the average particle diameter of the filler having a smaller average particle diameter is denoted by the reference sign PS2. If the difference between the average particle diameters of the two types of fillers is too small, a sufficient effect of dispersing the two types of fillers into the sealing resin layer 30 cannot be obtained. In order to obtain the sufficient effect, it is preferable to set the average particle diameter PS2 to be 0.5 times or less the average particle diameter PS1.

In addition, in the case where the filler having the larger average particle diameter is injected in the densest manner (in a closest packing manner) in a three-dimensional space, if the filler having the smaller average particle diameter has a size with which the filler can enter the gaps between the particles of the larger filler, the effect of gradually changing the total volume density of the fillers in the sealing resin layer 30 may easily be obtained. In order to allow the smaller filler to enter the gaps between the particles of the closely packed larger filler, it is preferable to set the average particle diameter PS2 to be 0.29 times or less the average particle diameter PS1.

FIG. 2C is a graph illustrating an example of the frequency distribution of the particle diameters of all the fillers dispersed throughout the sealing resin layer 30 of the electronic component according to the first embodiment. The horizontal axis denotes particle diameter, and the vertical axis denotes the number of filler particles. Peaks of the frequency distribution appear in a relatively small particle diameter range and a relatively large particle diameter range. When two peaks appear in the frequency distribution of the particle diameters as mentioned above, it can be said that two types of fillers having different particle diameters are included in the sealing resin layer 30. Note that, if the difference between the particle diameters of the two types of fillers is small, or if there are large variations in the particle diameters of the fillers, the feet of the two peaks may sometimes overlap each other. Also in this case, when two peaks that are spaced apart from each other appear, it can be said that two types of fillers are included in the sealing resin layer 30.

The frequency distribution graph illustrated in FIG. 2C does not need to cover all the fillers included in the sealing resin layer 30. For example, in the graph in FIG. 1, which illustrates the volume density distribution of each of the fillers, frequency distribution of the diameters of a plurality of filler particles that are present at the height at which the two types of fillers are present in a mixed manner may be obtained. Also in this case, when two peaks that are spaced apart from each other appear, it can be said that two types of fillers are included in the sealing resin layer 30.

The densities of the two types of fillers that are used in the electronic component according to the first modification of the first embodiment will now be described with reference to FIG. 2D.

FIG. 2D is a schematic diagram illustrating particles of the two types of fillers. The average particle diameters of the two types of fillers are the same as each other. The density of the filler having a higher density is denoted by the reference sign PD1, and the density of the filler having a lower density is denoted by the reference sign PD2. Here, the wording "density of the filler" refers to the density of the material of each particle. In general, when materials of particles are different from one another, the densities of the particles are also different from one another, and thus, in the first modification of the first embodiment, it can be said that two types of fillers having different materials are dispersed in the binder of the sealing resin layer 30. The filler having the higher density moves downward before the sealing resin layer 30 is cured, and this generates a distribution in which the total volume density of the fillers in the area of the sealing resin layer 30 that is located on the side on which the substrate 10 (FIG. 1) is present is higher than that in the area of the sealing resin layer 30 that is located on the side on which the top surface of the sealing resin layer 30 is present. As a result, the volume density distribution illustrated in the graph in FIG. 1 is obtained.

If the difference between the densities of the two types of fillers is small, a sufficient effect of dispersing the two types of fillers into the sealing resin layer 30 cannot be obtained. In order to obtain the sufficient effect, it is preferable to set the density PD2 to be 0.5 times or less the density PD1.

In the second modification of the first embodiment, when the average particle diameters and the densities of the two types of fillers are both different from one another, it is preferable to set the average mass of the heavier filler to be 120 times or more the average mass of the lighter filler. Here, the wording "average mass of the filler" refers to the average value of the masses of a plurality of particles of the filler. By setting 120-fold or more difference in the average mass, a sufficient effect of dispersing two types of fillers into the sealing resin layer 30 can be obtained.

Second Embodiment

An electronic component according to the second embodiment will now be described with reference to FIG. 3. Description of a configuration that is common to the electronic component according to the first embodiment will be omitted.

FIG. 3 includes a sectional view of the electronic component according to the second embodiment and a graph illustrating the volume density of each filler. In the first embodiment, the two types of fillers at least one of whose average particle diameter and density are different from each other are dispersed in the sealing resin layer 30. In the second embodiment, three types of fillers are dispersed in the sealing resin layer 30. For example, in the sealing resin layer 30, the first type of filler, the second type of filler, and the third type of filler mainly accumulate in a lower portion, an intermediate portion, and an upper portion, respectively. As in the first embodiment, the total volume density of the fillers gradually decreases in the upward direction from the substrate 10. Thus, advantageous effects similar to those of the first embodiment can be obtained. Note that four or more types of fillers may be dispersed into the sealing resin layer 30. By increasing the number of types of fillers to be dispersed into the sealing resin layer 30, the degree of freedom regarding the volume density distribution of the fillers can be increased.

Third Embodiment

An electronic component according to the third embodiment will now be described with reference to FIG. 4. Description of a configuration that is common to the electronic component according to the first embodiment will be omitted. In the first embodiment, the total volume density of the fillers is set to decrease in the upward direction from the substrate 10. In the third embodiment, the total volume density of fillers does not need to have such a distribution.

FIG. 4 is a graph illustrating volume density distribution and thermal conductivity distribution of each filler included in the sealing resin layer 30 (FIG. 1) of the electronic component according to the third embodiment. The horizontal axis denotes a position with respect to the top surface of the substrate 10 in the height direction. The left vertical axis denotes volume density. The right vertical axis denotes thermal conductivity. Also in the present embodiment, two types of fillers are included in the sealing resin layer 30 as in the first embodiment.

In the graph, the thickest solid line indicates the total volume density of the fillers. The second-thickest solid line indicates the volume density of the first filler. The thinnest solid line indicates the volume density of the second filler. The first filler is mainly distributed in a relatively lower area, and the second filler is mainly distributed in a relatively upper area. The sum of the volume densities of the two types of fillers is approximately constant regardless of the height. The thermal conductivity of the first filler, which is mainly distributed in a relatively lower area, is higher than the thermal conductivity of the second filler, which is mainly distributed in a relatively upper area.

The dashed line in the graph illustrated in FIG. 4 indicates the thermal conductivity of the sealing resin layer 30 (FIG. 1) that includes the binder and the fillers. In the third embodiment, the filler having a relatively high thermal conductivity is mainly distributed in a relatively lower area, and the filler having a relatively low thermal conductivity is mainly distributed in a relatively upper area. In addition, the total volume density of the fillers is constant regardless of the height. Thus, the thermal conductivity of the sealing resin layer 30 decreases from the lower side toward the upper side.

Next, advantageous effects of the third embodiment will be described. Heat generated in the heat-generating area of the semiconductor chip 20 (FIG. 1) is preferentially conducted to the substrate 10 via a lower area of the sealing resin layer 30 in which the thermal conductivity is high. Therefore, as in the first embodiment, dissipation of the heat from the heat-generating area can be improved.

For example, hexagonal boron nitride (h-BN), alumina, or the like can be used as the material of the filler having a relatively high thermal conductivity. Crystalline silica can be used as the material of the filler having a relatively low thermal conductivity. The density of hexagonal boron nitride and the density of alumina are each higher than the density of crystalline silica. Thus, the filler made of hexagonal boron nitride or alumina can be distributed in a relatively lower area, and the filler made of crystalline silica can be distributed in a relatively upper area.

A modification of the third embodiment will now be described. Although the total volume density of the two types of fillers is set constant regardless of the height in the third embodiment, the total volume density may have a distribution as in the first embodiment. In this case, the distribution of the volume density of the filler having a relatively high thermal conductivity may be biased toward the lower area compared with the distribution of the volume density of the filler having a relatively low thermal conductivity. With such a distribution, the thermal conductivity of a lower area of the sealing resin layer 30 can be set to be further higher than the thermal conductivity of an upper area of the sealing resin layer 30.

In the first embodiment, the second embodiment, and the third embodiment, which have been described above, although the bottom surface, the side surfaces, and the top surface of the semiconductor chip 20 are all sealed with the sealing resin layer 30, the bottom surface and the side surfaces may be sealed, and the top surface may be exposed.

Each of the above-described embodiments is an example, and it is obvious that the configurations according to the different embodiments may be partially replaced with one another or may be combined with one another. Similar advantageous effects obtained in similar configurations according to the plurality of embodiments are not described in every embodiment. In addition, the present disclosure is not limited to the above-described embodiments. For example, it is obvious to those skilled in the art that various changes, improvements, and combinations can be made.

What is claimed is:
1. An electronic component comprising:
a substrate;
a semiconductor chip that is mounted on the substrate; and
a sealing resin layer that seals the semiconductor chip, wherein the sealing resin layer includes
a binder, and
at least two types of fillers that have a plurality of particles dispersed in the binder and at least one of whose physical quantities, which are average particle diameter and density, are different from each other, wherein a total volume density of the fillers in the sealing resin layer decreases in an upward direction from the substrate, a portion of the sealing resin layer in a height direction of the sealing resin layer has an area in which the two types of fillers are present in a mixed manner, and the area in which the two types of filters are present in the mixed manner is between a height of a first surface of the semiconductor chip facing the substrate and a height of a second surface of the semiconductor chip opposite to the first surface in the height direction of the sealing resin layer.

2. The electronic component according to claim 1, wherein the semiconductor chip is mounted face down on the substrate by flip-chip bonding, and the sealing resin layer is provided at least between the semiconductor chip and the substrate and on a portion of the substrate surrounding the semiconductor chip.

3. The electronic component according to claim 1, wherein among average masses of the at least two types of fillers, the largest average mass is 120 times or more the smallest average mass.

4. The electronic component according to claim 1, wherein among the average particle diameters of the at least two types of fillers, the smallest average particle diameter is 0.29 times or less the largest average particle diameter.

5. The electronic component according to claim 1, wherein the two types of fillers have different thermal conductivities, and distribution of the volume density of the filler having a higher thermal conductivity is biased toward a lower area in the sealing resin layer compared with distribution of the volume density of the filler having a lower thermal conductivity.

6. The electronic component according to claim 2, wherein among average masses of the at least two types of fillers, the largest average mass is 120 times or more the smallest average mass.

7. The electronic component according to claim 2, wherein among the average particle diameters of the at least two types of fillers, the smallest average particle diameter is 0.29 times or less the largest average particle diameter.

8. The electronic component according to claim 3, wherein among the average particle diameters of the at least two types of fillers, the smallest average particle diameter is 0.29 times or less the largest average particle diameter.

9. The electronic component according to claim 6, wherein among the average particle diameters of the at least two types of fillers, the smallest average particle diameter is 0.29 times or less the largest average particle diameter.

10. The electronic component according to claim 2, wherein the two types of fillers have different thermal conductivities, and distribution of the volume density of the filler having a higher thermal conductivity is biased toward a lower area in the sealing resin layer compared with distribution of the volume density of the filler having a lower thermal conductivity.

11. The electronic component according to claim 3, wherein the two types of fillers have different thermal conductivities, and distribution of the volume density of the filler having a higher thermal conductivity is biased toward a lower area in the sealing resin layer compared with distribution of the volume density of the filler having a lower thermal conductivity.

12. The electronic component according to claim 4, wherein the two types of fillers have different thermal conductivities, and distribution of the volume density of the filler having a higher thermal conductivity is biased toward a lower area in the sealing resin layer compared with distribution of the volume density of the filler having a lower thermal conductivity.

13. The electronic component according to claim 6, wherein the two types of fillers have different thermal conductivities, and distribution of the volume density of the filler having a higher thermal conductivity is biased toward a lower area in the sealing resin layer compared with distribution of the volume density of the filler having a lower thermal conductivity.

14. The electronic component according to claim 7, wherein the two types of fillers have different thermal conductivities, and distribution of the volume density of the filler having a higher thermal conductivity is biased toward a lower area in the sealing resin layer compared with distribution of the volume density of the filler having a lower thermal conductivity.

15. The electronic component according to claim 8, wherein the two types of fillers have different thermal conductivities, and distribution of the volume density of the filler having a higher thermal conductivity is biased toward a lower area in the sealing resin layer compared with distribution of the volume density of the filler having a lower thermal conductivity.

16. The electronic component according to claim 9, wherein the two types of fillers have different thermal conductivities, and distribution of the volume density of the filler having a higher thermal conductivity is biased toward a lower area in the sealing resin layer compared with distribution of the volume density of the filler having a lower thermal conductivity.

17. The electronic component according to claim 1, wherein in the area a volume density of the first filler is equal to a volume density of the second filler at a point.

18. The electronic component according to claim 1, wherein in the area:

a volume density of the first filler decreases to a median value between minimum volume density and a maximum volume density of the first filler in the sealing resin at a first point in the height direction, and a volume density of the second filler increases to a median value between minimum volume density and a maximum volume density of the second filler in the sealing resin at a second point in the height direction.

19. An electronic component comprising:
a substrate;
a semiconductor chip that is mounted on the substrate; and
a sealing resin layer that seals the semiconductor chip,
wherein the sealing resin layer includes
   a binder, and
   at least two types of fillers that have a plurality of particles dispersed in the binder and at least one of whose physical quantities, which are average particle diameter and density, are different from each other, wherein
a total volume density of the fillers in the sealing resin layer decreases in an upward direction from the substrate,
a portion of the sealing resin layer in a height direction of the sealing resin layer has an area in which the two types of fillers are present in a mixed manner, and
the at least two types of fillers have a same composition as each other.

* * * * *